(12) United States Patent
McDonough et al.

(10) Patent No.: US 6,998,292 B2
(45) Date of Patent: Feb. 14, 2006

(54) APPARATUS AND METHOD FOR INTER-CHIP OR CHIP-TO-SUBSTRATE CONNECTION WITH A SUB-CARRIER

(75) Inventors: Robert J. McDonough, Ventura, CA (US); Weimin Sun, Thousand Oaks, CA (US)

(73) Assignee: Vitesse Semiconductor Corporation, Camarillo, CA (US)

( * ) Notice: Subject to any disclaimer, the term of this patent is extended or adjusted under 35 U.S.C. 154(b) by 78 days.

(21) Appl. No.: 10/308,458

(22) Filed: Dec. 2, 2002

(65) Prior Publication Data

US 2003/0143831 A1 Jul. 31, 2003

Related U.S. Application Data

(60) Provisional application No. 60/339,896, filed on Nov. 30, 2001.

(51) Int. Cl.
*H01L 21/44* (2006.01)

(52) U.S. Cl. ............... 438/107; 438/108; 438/109; 257/685; 257/686; 257/777

(58) Field of Classification Search ............... 257/685, 257/686, 777; 438/108, 109, 107
See application file for complete search history.

(56) References Cited

U.S. PATENT DOCUMENTS

| | | | |
|---|---|---|---|
| 4,346,355 A | 8/1982 | Tsukii | |
| 4,995,815 A | 2/1991 | Buchanan et al. | |
| 5,014,161 A | 5/1991 | Lee et al. | |
| 5,266,912 A | 11/1993 | Kledzik | |
| 5,294,897 A | 3/1994 | Notani et al. | |
| 5,349,495 A | 9/1994 | Visel et al. | |
| 5,406,125 A | 4/1995 | Johnson et al. | |
| 5,459,287 A | 10/1995 | Swamy | |
| 5,737,187 A | 4/1998 | Nguyen et al. | |
| 5,832,598 A | 11/1998 | Greenman et al. | |
| 5,869,894 A * | 2/1999 | Degani et al. | ............... 257/723 |
| 6,086,383 A | 7/2000 | Fasano et al. | |
| 6,091,147 A | 7/2000 | Furuyama | |
| 6,130,483 A | 10/2000 | Shizuki et al. | |
| 6,137,693 A | 10/2000 | Schwiebert et al. | |
| 6,143,616 A | 11/2000 | Geusic et al. | |
| 6,194,669 B1 | 2/2001 | Bjorndahl et al. | |
| 6,194,750 B1 | 2/2001 | Carroll et al. | |
| 6,204,448 B1 | 3/2001 | Garland et al. | |
| 6,211,541 B1 | 4/2001 | Carroll et al. | |
| 6,215,377 B1 | 4/2001 | Douriet | |
| 6,297,551 B1 * | 10/2001 | Dudderar et al. | ............ 257/723 |

OTHER PUBLICATIONS

International Search Report dated Jun. 30, 2003 for International Application No. PCT/US02/38709, filed Dec. 02, 2002, mailed Jul. 23, 2003 (4 pages).

* cited by examiner

*Primary Examiner*—Mary Wilczewski
*Assistant Examiner*—Toniae M. Thomas
(74) *Attorney, Agent, or Firm*—Christie, Parker & Hale, LLP

(57) ABSTRACT

The present invention is directed to a method and an apparatus where the standard wire bonding of TBGA's is replaced using a solid intermediate subcarrier on which the die may be flip chipped and which may then be flip chipped onto the substrate. The subcarrier has a number of conductors replacing the wire bond. In this manner, a better reflection suppression, better impedance matching, smaller conductor pitch and other advantages are achieved. The subcarrier may also be used for mounting multiple dies in a single substrate.

14 Claims, 5 Drawing Sheets

US 6,998,292 B2

APPARATUS AND METHOD FOR INTER-CHIP OR CHIP-TO-SUBSTRATE CONNECTION WITH A SUB-CARRIER

CROSS-REFERENCE TO RELATED APPLICATIONS

This application claims the benefit of U.S. provisional application No. 60/339,896, filed Nov. 30, 2001 which is hereby incorporated by reference as if set forth in full herein.

BACKGROUND OF THE INVENTION

The present invention relates generally to transmission of electrical signals within electronic packages, and more particularly to the transmission of electrical signals to or from dies for integrated circuits.

Integrated circuits are often formed on one or more dies placed within a package. Within the package signals are provided to the die, or chip. Often the signals are provided using wires wire bonded to the die.

Integrated circuits, however, are increasingly being operated at very high clock rates using very high frequency signals, and doing so with technology process that form very dense circuitry. The high frequency signals pose difficulties when used with wire bonds as the wires are often not shielded, allowing for increased signal attenuation, crosstalk, and irradiation, as well as heat dissipation and other problems. Moreover, wire bonds generally become very inductive at high frequencies, and it is often difficult to properly match impedances.

Flip chip mounting schemes are sometimes used to increase signal transfer performance. The flip chip configuration, however, is more expensive. In addition, thermal dissipation characteristics may not be sufficient for high frequency circuits, particularly high frequency circuits using technology which is less electrically efficient.

BRIEF SUMMARY OF THE INVENTION

The present invention provides an apparatus and method of for providing electrical connections to a die. In one aspect the invention provides a method of electrically connecting a die to a substrate, comprising providing a die having an upper surface with a number of connecting points; providing a substrate having an upper surface, a lower surface, a cavity adapted to receive the die, a number of connection points at the upper surface of the substrate, and a number of connection elements for connection to an electrical circuit external to the substrate; introducing the die into the cavity; providing a subcarrier including a number of electrical conductors; and electrically connecting connection points of the die to connection points of the substrate by positioning the subcarrier with respect to the die and the substrate.

In another aspect the invention provides a method of electrically connecting a die to another element, comprising providing a die having an upper surface having a number of connection points; providing an element having an upper surface with a number of connection points; providing a subcarrier element having a surface with a number of electrical conductors; providing a substrate having a number of connection points and a cavity adapted to receive the die and the other element; fixing the die and the subcarrier element in relation to each other so that connection points of the die obtain electrical connection to at least one of the conductors of the subcarrier element; fixing the subcarrier element and the element in relation to each other so that the connection points of the element obtain electrical connection to at least one of the conductors of the subcarrier element; introducing the die the element in the cavity; and providing electrical contact between the substrate and at least one of the die, the element, and the subcarrier element.

In another aspect the invention provides an apparatus comprising a die electrically connected to a substrate, the apparatus comprising a substrate having a number of connection points at a first substrate surface, a number of connection elements for connection to an electrical circuit external to the substrate, and a cavity adapted to receive the die, each connection element being electrically connected to a corresponding connection element; a die having first die surface having a number of connection points and being positioned in the cavity; and a subcarrier element having a number of electrical conductors wherein the die and subcarrier element are fixed in relation to each other so that connection points of the die are in electrical contact with at least one of the conductors of the subcarrier element, and the subcarrier element and substrate are fixed in relation to each other so that connection points of the subcarrier element are in electrical contact with at least one of the conductors of the substrate.

In another aspect the invention provides an apparatus for electrically connecting a die to an element, the apparatus comprising a substrate having a number of connection points and a cavity; a die having an upper surface and a number of connection points, the die being positioned in the cavity; a element having an upper surface with a number of connection points and being positioned in the cavity; and a subcarrier element having a surface with a number of electrical conductors, wherein the die and subcarrier element are fixed in relation to each other such that the connection points of the die are in electrical contact with at least one of the conductors of the subcarrier element, and the subcarrier element and the element are fixed in relation to each other such that the connection points of the other element are in electrical contact with at least one of the conductors of the subcarrier element.

Aspects of the invention are apparent from the following detailed description when viewed in conjunction with the accompanying drawings.

DETAILED DESCRIPTION

The present invention relates generally to connections to semiconductor dies, and more particularly to connections to semiconductor dies using a subcarrier. In some embodiments the invention is directed to a method and an apparatus where a die is flip chipped onto a subcarrier which may then be flip chipped onto a substrate. The subcarrier has a number of conductors providing for signal transmission to the die. The subcarrier, in various embodiments, is used for mounting multiple dies in a single substrate.

Figure 1:
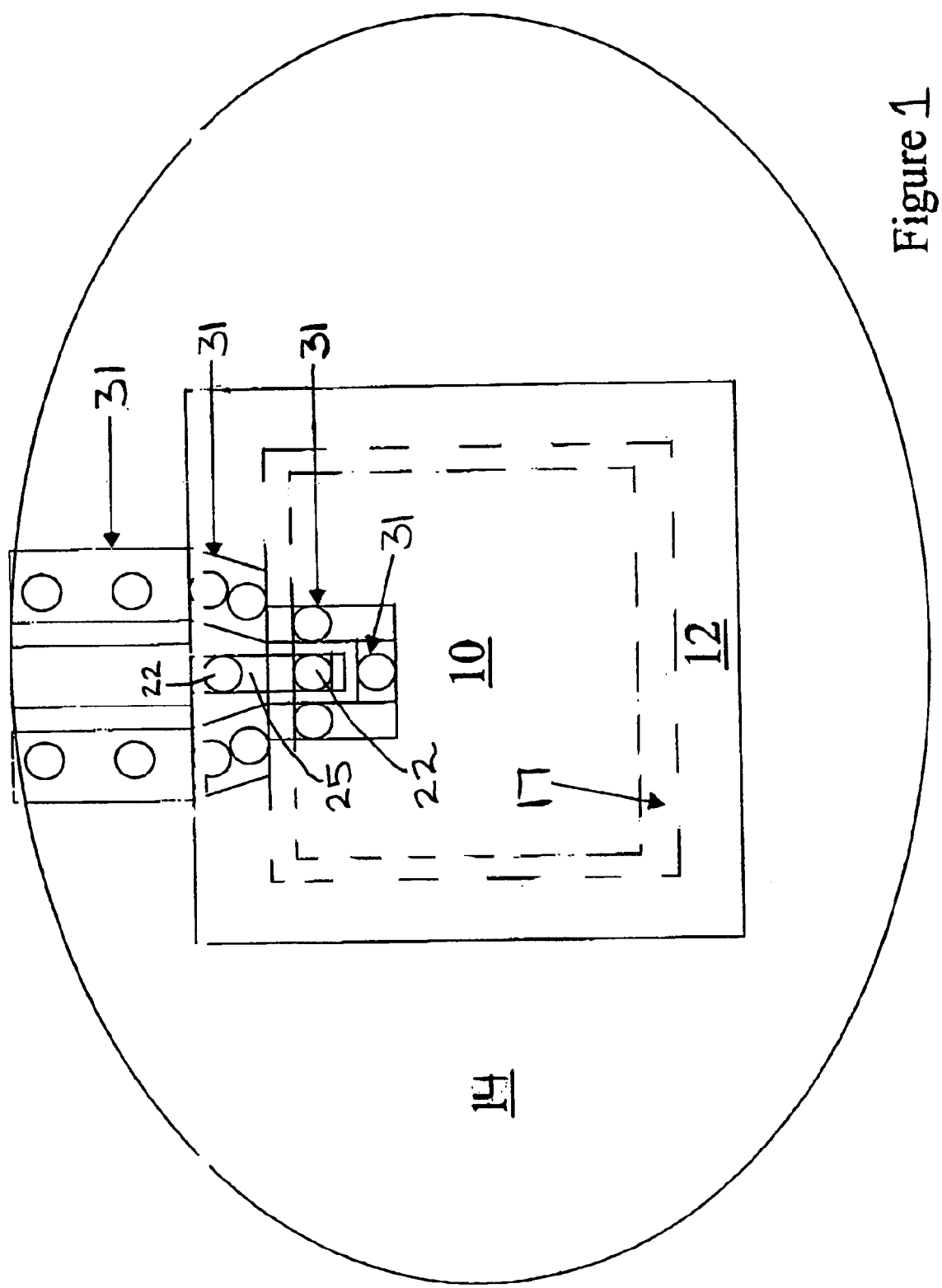
FIG. 1 is a top view of a device having a die mounted in a cavity of a substrate.

FIG. 1 is a top view of a die 10 mounted in a substrate 14. The die is within a cavity 17 of the substrate. A subcarrier 12 is mounted over the die and portions of the substrate. The subcarrier includes electrical conductors, with an electrical conductor 25 shown in FIG. 1. The electrical conductor is used to pass a signal from the substrate to the die. The electrical conductor, in various embodiments, is a microstrip, stripline, or coplanar wave guide (CPWG).

The electrical conductor is connected to the die and the substrate using bumps 22 or connection points. As illustrated in FIG. 1 the electrical conductor is shielded using vias 31 to improve transmission line characteristics. In further embodiments ground planes (not shown) are also used to shield the electrical connector. The conductors may be adapted to have well defined and selected electrical properties, such as well-defined inductance, impedance, and/or cross talk. Some of these properties may be controlled by controlling the dimensions of the conductors and others by the relative positioning of conductors.

In one embodiment the subcarrier 12 is produced as a standard PCB, as is comprised of FR-4, for example. In another embodiment the subcarrier is a semiconductor substrate. In another embodiment the subcarrier 12 is made of a stiff, non-conducting material on the surface of which, or within shielded by grounds, is added the conductors, such as by adding a thin layer of a metal and then removing parts thereof in order to define the conductors.

The substrate and the die are positioned on a thermal heatsink. The heatsink is adapted to dissipate heat generated by the die. In various embodiments thermally conducting epoxy is placed between the die and the heatsink to substantially affix the relative positions of the die and heatsink.

Figure 2:
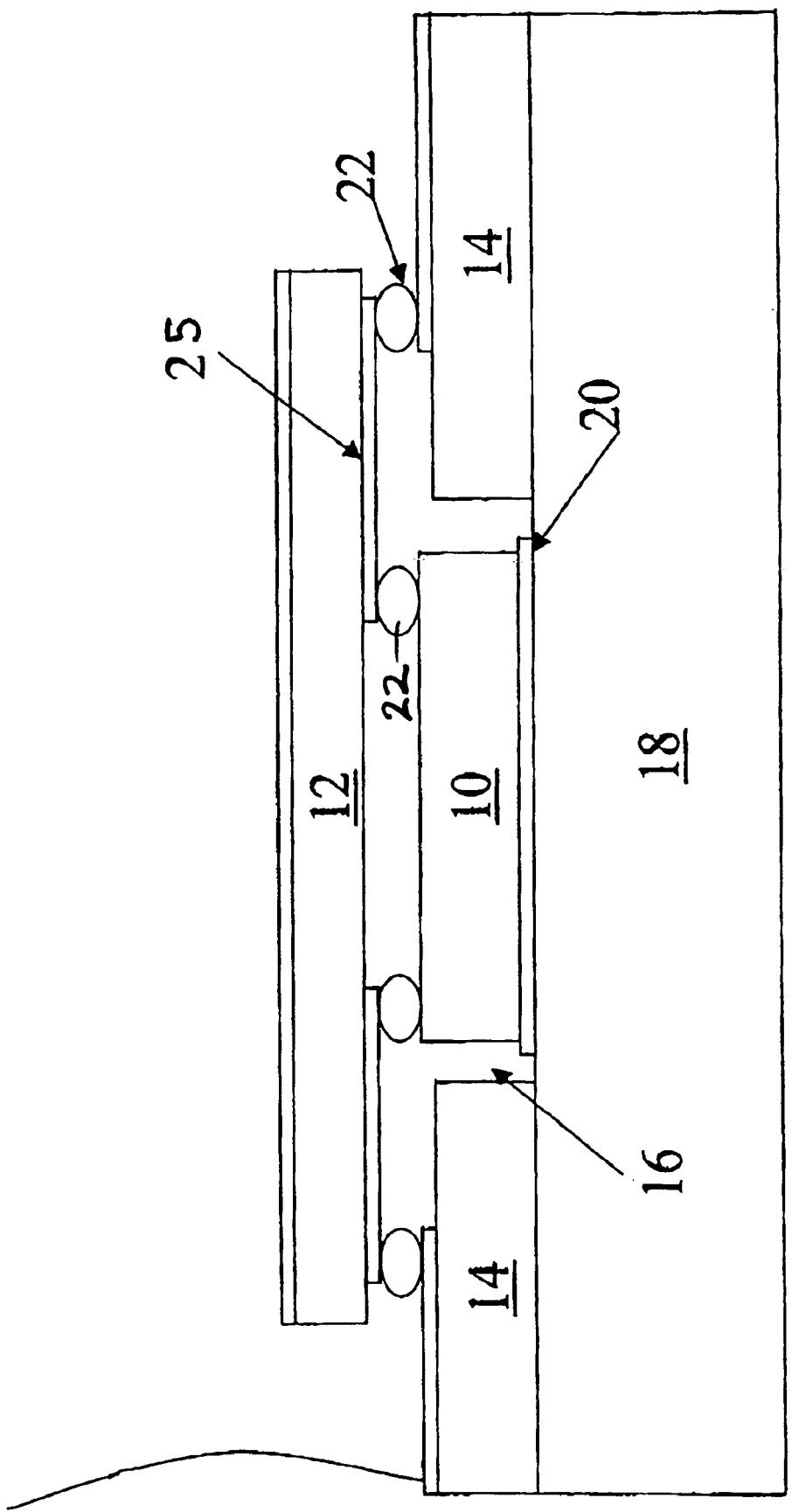
FIG. 2 is a cross-section through a portion of the device of FIG. 1

FIG. 2 is a cross-section through the device of FIG. 1. In FIG. 2 a die 10 is coupled to a subcarrier 12. The subcarrier 12 has a number of electrical conductors, conductive interconnects, solder bumps as illustrated, electrically connect contact points of the die to electrical conductors of the subcarrier. The die is within a cavity, or hole or aperture, in the substrate 14. Electrical conductors of the substrate are electrically connected to the electrical conductors of the subcarrier using conductive elements, again illustrated as solder bumps.

In one embodiment, and as illustrated in FIG. 2, the die is flip chipped onto the subcarrier. The subcarrier is then flip chipped onto the substrate, with the die placed into a cavity or hole 13 in substrate 14. The substrate 14 is mounted on a heat sink 18 to which the die 10 is thermally attached via a thermally conducting epoxy 20. In some embodiments the substrate and the heat sink are coupled prior to flip chipping the subcarrier onto the substrate. In such an embodiment, the thermally conducting epoxy 20 is applied on the heat sink 18 or die 10 before flipping the subcarrier 12 and die 10 onto the substrate 14. The thickness of the substrate 14 and the die 10 are chosen, in one embodiment, so that a small gap is provided between the die 10 and the heat sink 18 in order to provide space for the epoxy 20. Also, as illustrated in FIG. 1 as the epoxy 20 is provided on the lower side of the die 10 (the side opposite to the side having contacting areas), an electrically conductive epoxy 20 may be used.

Figure 3:
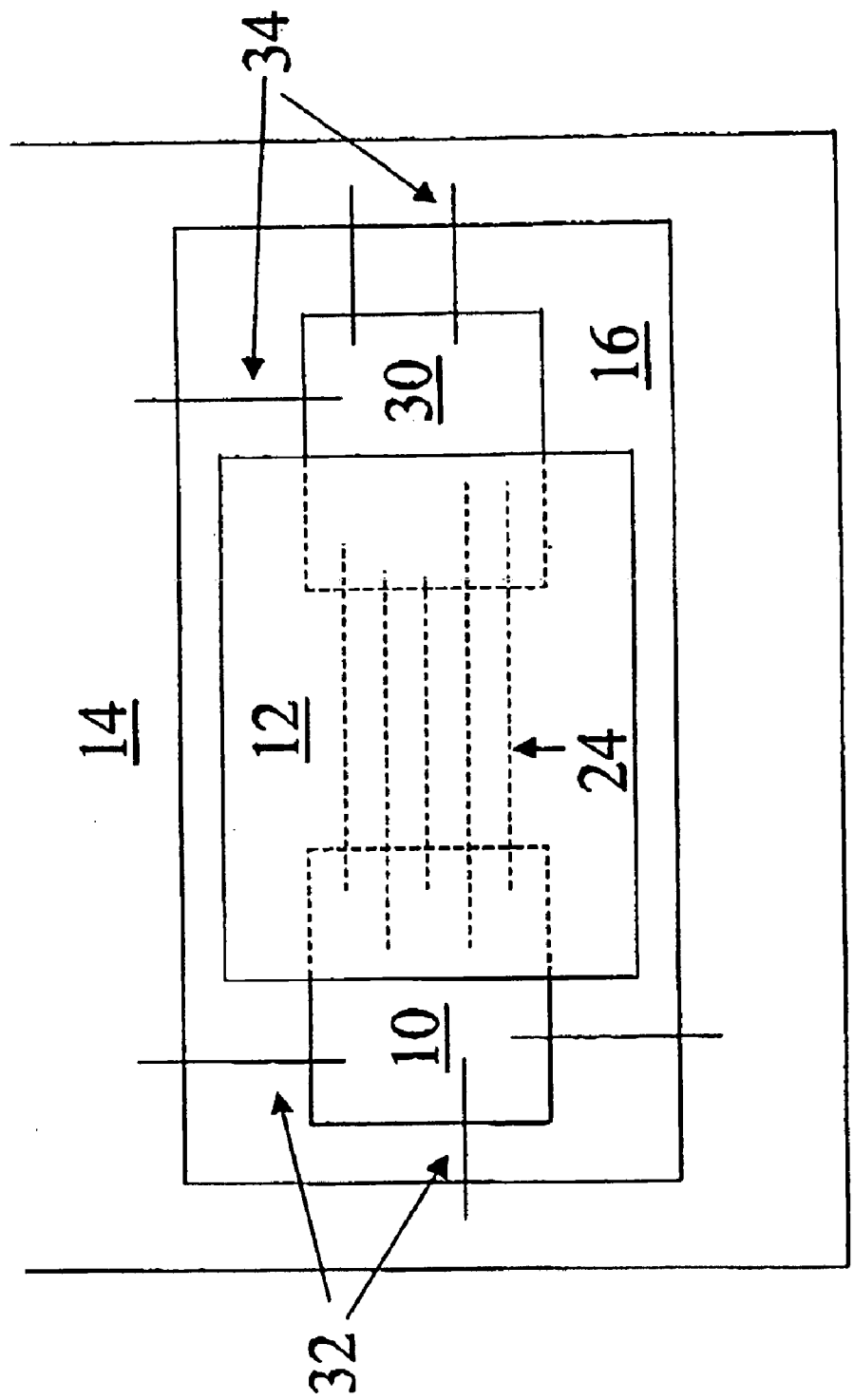
FIG. 3 is an exemplary embodiment of a die-to-die connection using a subcarrier element.

FIG. 3 illustrates an embodiment of a die-to-die connection using a subcarrier element. As shown in FIG. 3, two dies 10 and 30 are interconnected using a subcarrier 12 having a number of conductors 24. In an exemplary embodiment, the two dies 10, 30 require a high-speed communication, whereas the communication to the outside components is off a more of a low-speed nature, which is achieved utilizing wire bonding. Thus, wire bonds 32 and 34 are provided from the individual die 10, 30 to the substrate 14. Alternatively, the subcarrier 12 may be made larger in area so as to also handle the connections 32 and 34. As illustrated, the two dies 10 and 30 are positioned in a cavity 16 and the dies 10 and 30 are, in one embodiment, thermally connected to a heat sink (not shown) present at the bottom of the cavity 16 using a thermal conductive epoxy (not shown).

Figure 4:
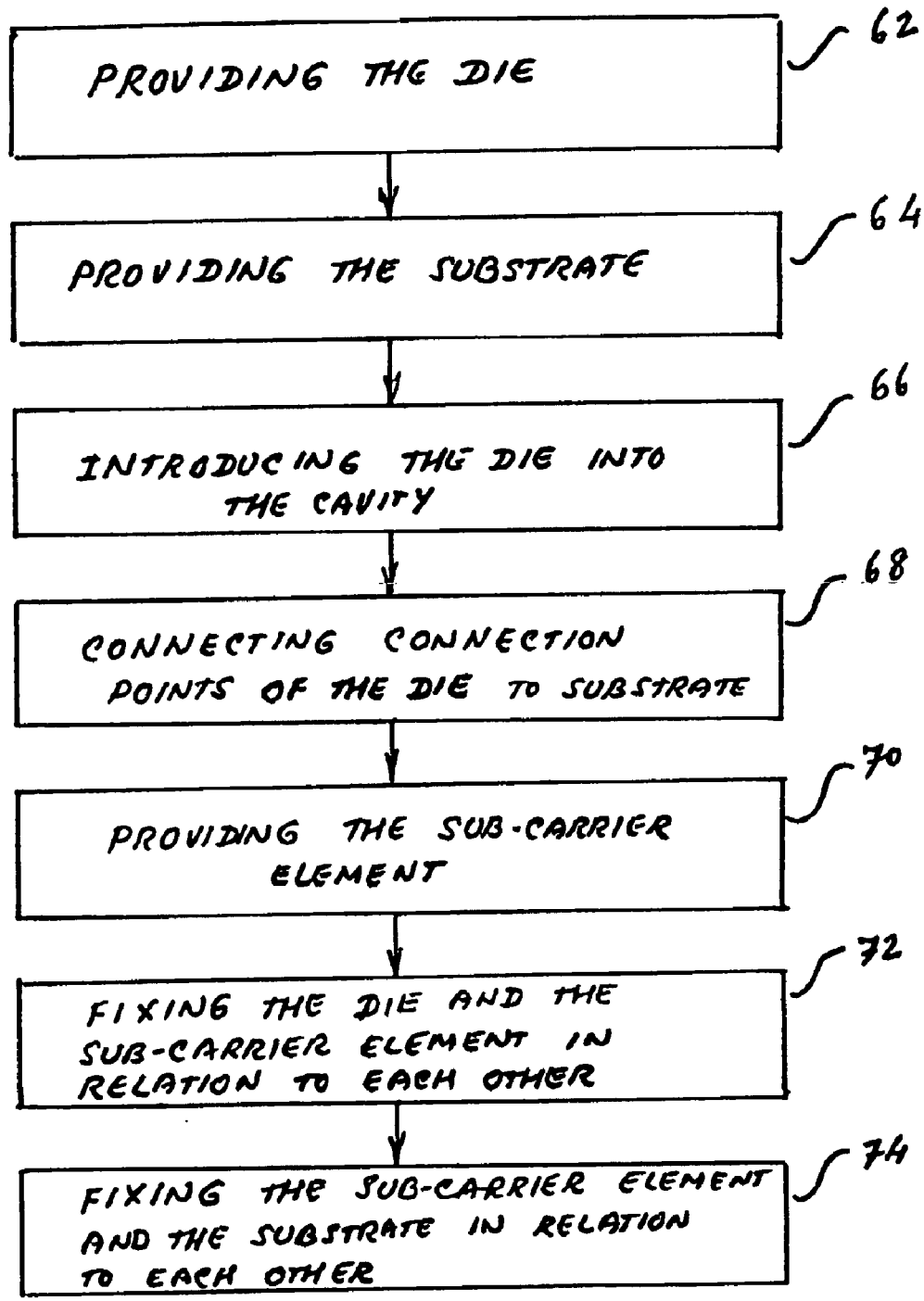
FIG. 4 is a flow chart depicting a method for electrically connecting a die to a substrate.

FIG. 4 is a flow chart depicting method steps 60 for electrically connecting a die to a substrate. In an exemplary embodiment, the die has an upper surface with a number of connection points, and the substrate has at an upper surface, a number of connection points for connection to the die, a number of connection elements for connection to an electrical circuit external to the substrate, and a cavity adapted to receive the die. Each connection element is electrically connected to a connection element.

The method 60 includes providing 62 the die, providing 64 the substrate, introducing 66 the die into the cavity, and electrically connecting 68 connection points of the die to connection points of the substrate 14. The method 60 further includes providing 70 a subcarrier element having a surface with a number of electrical conductors, fixing 72 the die and the subcarrier element in relation to each other such that the connection points of the die are in electrical contact with at least one of the conductors of the subcarrier element. The method 60 further includes fixing 74 the subcarrier element and the substrate in relation to each other such that the connection points of the subcarrier element are also in contact with at least one of the conductors of the substrate.

In one embodiment, instead of providing a large number of wires, the subcarrier element may have all the conductors used, thereby eliminating the need for a large number of wires. In various embodiments, the substrate and the die are ones of the types normally used in TGBA packages. In some embodiments the connection elements for providing contact to the external circuit are conducting balls. In other embodiments other types of contacting elements, such as normal pins, may be used.

In one embodiment, the subcarrier element is an element having a surface with the conductors thereon for conducting electrical current. The subcarrier element is at least substantially stiff to permit easy handling and also to allow sizing and relative positioning of the conductors to ensure that the conductors are well-defined. Well-defined conductors allows for well defined electrical properties which is often preferable in die bonding processes. Especially at very high frequencies, the electrical properties of the conductors are relatively important. In an exemplary embodiment, "stiff" relates to stiff in relation to its size and weight so that the die may be handled by handling the subcarrier.

Additionally, in one embodiment the subcarrier element has an overall area which is larger than that of the die and that of the opening of the cavity. This permits the subcarrier element to overlap and close the cavity and thereby obtain contact to connecting points along the full periphery of the cavity, if desired.

In an exemplary embodiment, the die is an electrical circuit, such as an ASIC, Mux, Demux, Network processor, or TIA prepared using, e.g., LSI, VLSI techniques such as 0.18 $\mu$m technology, a 0.13 $\mu$m technology, or an 0.11 $\mu$m technology in CMOS, BiCMOS, SiGe, GaAs, InP, GaAs-HBT or the like.

Figure 5:
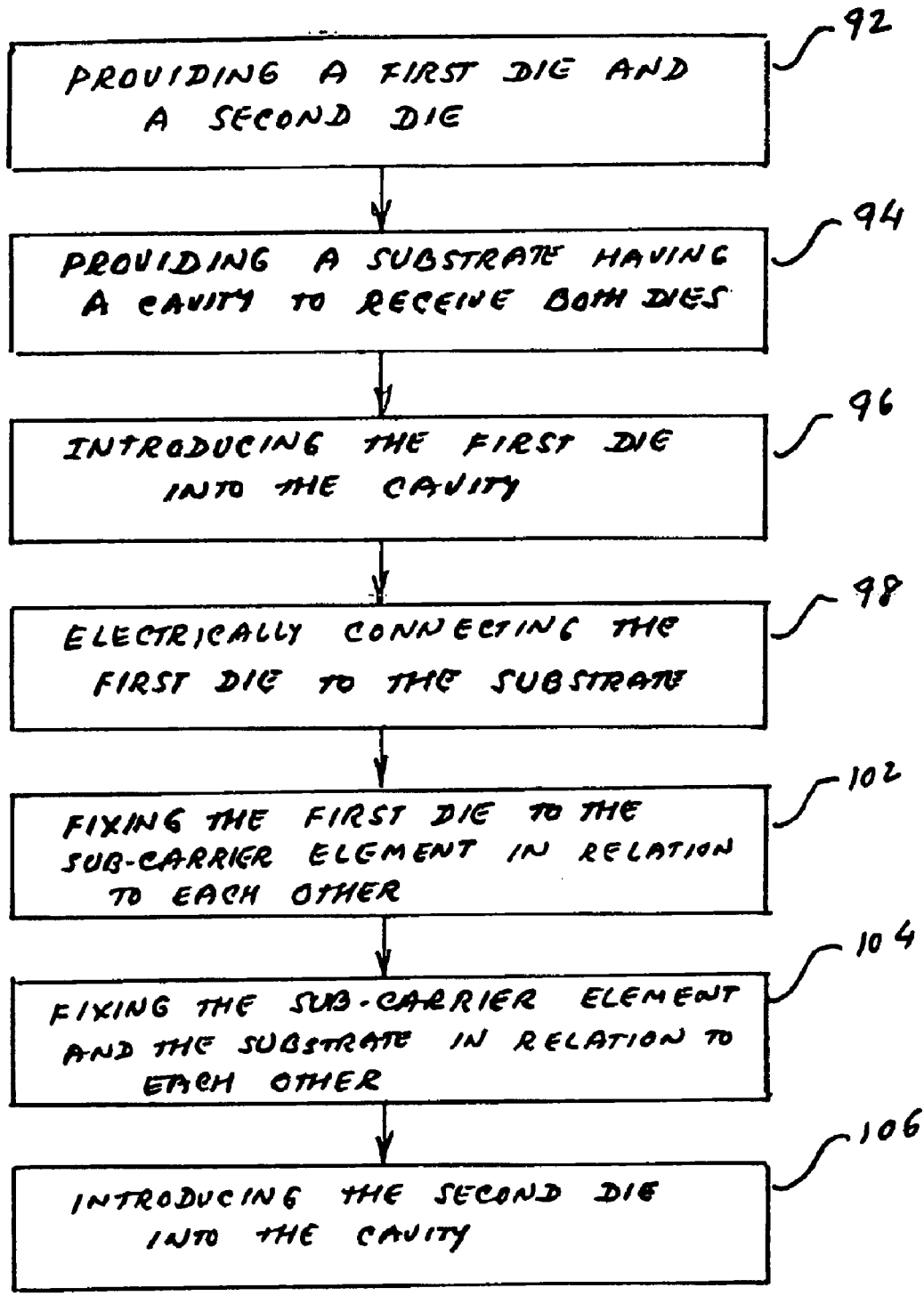
FIG. 5 is a flow chart of a method that includes introducing two dies into a cavity.

FIG. 5 is an exemplary embodiment describing a method 90 that includes introducing two dies into the cavity. In an exemplary embodiment, the method 90 includes providing 92 a first die and a second die, providing 94 the substrate having a cavity adapted to receive both the first die and the second die, introducing 96 the first die into the cavity, and electrically connecting 98 connection points of the first die to connection points of the substrate 14. The method further includes fixing 102 the first die to the subcarrier element in relation to each other such that the connection points of the first die is in electrical contact to at least one of the conductors of the subcarrier element The method further includes fixing 104 the subcarrier element and the substrate in relation to each other such that the connection points of the subcarrier element are in electrical contact to at least one of the conductors of the substrate and then introducing 106 the second die in the cavity. In an exemplary embodiment, introducing 106 the second die may be accomplished before fixing 104 the subcarrier element and the substrate in relation to each other to obtain electrical connection. The second die has an upper surface, which has a number of connection points similar to the first die.

In an exemplary embodiment, any number of dies may be provided, interconnected to each other and packed into a single substrate. The method for packing two dies or more than two dies is substantially the same.

In yet another exemplary embodiment, the invention is a method of electrically connecting a die to an another element, which may also be a die or another type of circuit, such as a memory circuit, a processor, an amplifier, a multiplexer or the like. In such an embodiment, providing of electrical contact to the substrate may take place by simple wire bonding. This type of the situation arises when the communication between the die and other element takes place at very high frequencies, such as e.g. an analysis or calculation, but where the reporting of the result out of the chip may be performed at considerably lower frequencies. The method of electrically connecting the die to another element is substantially the same.

The method includes providing the die having an upper surface with a number of connection points, providing the other element having an upper surface with a number of connection points, providing a subcarrier element having a surface with a number of electrical conductors, and providing a substrate having a number of connection points and a cavity adapted to receive the die and the other element. Once the required components are provided, the method involves fixing the die and the subcarrier element in relation to each other such that the connection points of the die obtain electrical connection to at least one of the conductors of the subcarrier element. The method then requires fixing the subcarrier element and other element in relation to each other so that connection points of the other element obtain electrical connection to at least one of the conductors of the subcarrier element, introducing the die and other element in the cavity, and finally providing electrical contact between the substrate and at least one of the die, the other element, and the subcarrier element.

Generally, it is preferred that the step of providing electrical contact comprises fixing the subcarrier element and substrate in relation to each other so that connection points of the substrate obtain electrical connection to at least one of the conductors of the subcarrier element. This might require a larger subcarrier element but would not require any significant adjustments to the process.

When the first die, the second die, the substrate and the other element are electrically connected, the connection points of the first die, the second die, the substrate and the other element preferably define at least substantially congruent planes. This has a number of advantages in the total assembly and/or fixing of the system. When the connectors of the subcarrier element defines a plane being parallel to the congruent planes, a fixed predetermined distance will exist between all connection points and the conductors.

The connection points of the die(s), substrate, and/or other element. will normally be predefined metallic pads or areas thereon. The size and shape thereof may vary. In one embodiment the connection points will be flat and coextending with the surface of the die, substrate and/or other elements. In another embodiment, the points may be convex parts of the die substrate, and/or other elements. In an exemplary embodiment, such convex parts are solder balls.

The electrical conductors of the subcarrier element may be exposed along their full length/width in order to be connectable at any point. Alternatively, only predetermined parts thereof, parts corresponding to positions of the connection points to which they are to provide electrical contact may be exposed. The remaining parts of the conductors may be covered, physically or electrically shielded, in order to prevent short-circuiting, oxidation, or leakage or cross-talk issues.

The fixing steps include abutting the connection points and conductors so as to obtain the electrical connection. In fact, in an alternative embodiment, the fixing steps include attaching the connection points and conductors to each other. This may be a standard flip chip process ensuring contact between all connection points and conductors.

Generally, dies become quite hot during operation and in particular during high frequency operation. Thus, the present method includes providing a heat sink and ensuring that at least part of the cavity is in thermal contact with the heat sink. Preferably, the thermal contact exists between the heat sink, the first die, the second die, and the other element.

The heat sink will in some substrate types be a metal part or block on which the substrate is formed. Thus, the cavity in the substrate may be one where part of the cavity wall is actually formed by the heat sink. Alternatively, a good thermal connection may be formed from the heat sink to the cavity wall. The good thermal connection between the die(s)/element and heat sink is accomplished by utilizing a thermally conducting material chosen from the group consisting of a fluid, a glue, an epoxy, a resilient material, and a foam. The thermally conducting material is introduced in the cavity prior to introducing the die(s)/element in the cavity.

In one embodiment the die is orientated within the cavity in such a manner that the upper surface points away from the cavity allowing the proper contact between the other surface of the die and the thermally conducting material. This is an advantage when the thermally conducting material also has an electrical conductivity. Such a material is generally not useful on the upper surface of the die because of the danger of short-circuiting of the contacting points.

In an exemplary embodiment, the subcarrier element is substantially stiff and is made of substantially electrically insulating carrier element having a number of electrical conductors on or at the surface. Electrical conductors on the subcarrier element are provided so as to fulfill predetermined electrical criteria. Electrical conductors have a predetermined characteristic impedance, sometime dependent on their widths, lengths, heights, and shielding, which may be chosen for high frequency applications and low noise applications. Additionally, part of the conductors may be electrically shielded from each other. This electrical shielding may be provided by others of the conductors. These other conductors may be positioned between the conductors to shield these from each other.

Consequently, the subcarrier element provides a simple and reproducible manner of providing a die-to-die bonding, a die-to-substrate bonding, and a die-to-any other type of element bonding with connections which are well-defined both as to the electrical characteristics, the shielding and the noise/cross talk characteristics.

In yet another exemplary embodiment, an apparatus comprising a die that is electrically connected to a substrate is disclosed. The apparatus includes the substrate having a number of connection points at an upper surface for connection to the die, a number of connection elements for connection to an electrical circuit external to the substrate, and a cavity adapted to receive the die. Each connection element is electrically connected to the other connection element. The die has an upper surface having a number of connection points and is positioned in the cavity. The apparatus further includes a subcarrier element that has a surface with a number of electrical conductors. The die and the subcarrier element are fixed in relation to each other so that the connection points of the die are in electrical contact with at least one of the conductors of the subcarrier element. Additionally, the subcarrier element and substrate are fixed in relation to each other so that the connection points of the subcarrier element are in electrical contact with at least one of the conductors of the substrate. In an exemplary embodiment, the connection points and conductors may abut each other, and preferably, the connection points and conductors are actually attached to each other, such as by heating, soldering or the like.

In order for the subcarrier element to function optimally, the positions of the electrical conductors of the subcarrier element need to overlap in a predetermined projection. In this manner, a simple abutting attaching may be facilitated. This may also mean that a specific subcarrier element needs to be designed for each die.

In an exemplary embodiment, the subcarrier element is made of a substantially electrically insulating material and includes a number of electrical conductors at or on a surface of the part to allow each electrical conductor to remain in contact with at least one contact point.

In yet another exemplary embodiment, one or more first conductors, of the number of electrical conductors extend from within a predetermined area to outside the predetermined area.

The implementation according to the preferred embodiment of a subcarrier substrate constitutes unique advancements to the art of broadband digital signal packaging technologies in several areas. For example, the wire bond is eliminated. The wire bond is preferably replaced with a printed transmission line in the form of Microstrip, stripline, coplanar wave-guide or similar other media that is appropriate for impedance matching, heat dissipation or subcarrier to substrate interfacing. Additionally, the thermal performance is not degraded by the implementation of substrate. High order mode suppression is achieved by the design through the use of vias electric walls in the immediate vicinity of the transition to form a shielded structure and a wave-guide cut-off of any higher order mode. The desired interconnect performance across broader frequency band is achieved by using better impedance matched transmission lines. Since this design utilizes similar flip chip technology, the chip to subcarrier alignment and manufacturability are generally guaranteed.

While the invention has been described in terms of various specific embodiments, those skilled in the art will recognize that the invention can be practiced otherwise than as specifically described but within the scope of claims and their equivalents supported by this disclosure.

What is claimed is:

1. A method of electrically connecting a die to a substrate, comprising:

providing a die having an upper surface with a number of connecting points;

providing a substrate having an upper surface, a lower surface, a cavity adapted to receive the die, a number of connection points at the upper surface of the substrate, and a number of connection elements for connection to an electrical circuit external to the substrate;

introducing the die into the cavity;

providing a subcarrier including a number of individually shielded electrical conductors;

electrically connecting connection points of the die to connection points of the substrate by positioning the subcarrier with respect to the die and the substrate; and wherein the electrical conductors are shielded by a number of vias.

2. The method according to claim 1 wherein electrically connecting connection points of the die to connection points of the substrate by positioning the subcarrier with respect to the die and the substrate comprises:

fixing the die and the subcarrier element in relation to each other so that connection points of the die obtain electrical connection to at least one of the conductors of the subcarrier element; and fixing the subcarrier element and the substrate in relation to each other so that conductors of the subcarrier element obtain electrical connection to at least one of the connection points of the substrate and so that the die is introduced into the cavity.

3. The method according to claim 2 further comprising providing a second die having an upper surface having a number of connection points, and wherein:

the cavity is adapted to receive both the die and the second die;

fixing the die and the subcarrier element in relation to each other further comprises fixing the second die and the subcarrier element to each other so that connection points of the second die obtain electrical connection to at least one of the conductors of the subcarrier element; and fixing the subcarrier element and the substrate in relation to each other further comprises introducing the second die in the cavity.

4. A method of electrically connecting a die to another element, comprising:

providing a die having an upper surface having a number of connection points;

providing an element having an upper surface with a number of connection points;

providing a subcarrier element having a surface with a number of individually shielded electrical conductors;

providing a substrate having a number of connection points and a cavity adapted to receive the die and the other element;

fixing the die and the subcarrier element in relation to each other so that connection points of the die obtain electrical connection to at least one of the conductors of the subcarrier element;

fixing the subcarrier element and the element in relation to each other so that the connection points of the element obtain electrical connection to at least one of the conductors of the subcarrier element;

introducing the die and the element in the cavity;

providing electrical contact between the substrate and at least one of the die, the element, and the subcarrier element; and wherein the electrical conductors are shielded by a number of vias.

5. A method according to claim 4, wherein providing electrical contact between the substrate and at least one of the die, the element, and the subcarrier element further comprises fixing the subcarrier element and the substrate in relation to each other so that connection points of the substrate obtain electrical connection to at least one of the conductors of the subcarrier element.

6. The method according to claim 5, wherein the connection points of the die, the element, and the substrate define at least substantially congruent planes.

7. The method according to claim 6, wherein the conductors of the subcarrier element define a plane parallel to the congruent planes.

8. The method according to claim 4, wherein the connection points abut the conductors so as to obtain the electrical connection.

9. The method according to claim 4, wherein the connection points are electrically connected to the conductors.

10. The method according to claim 4 further comprising providing a heat sink.

11. The method according to claim 10, wherein providing the substrate further comprises:

providing the cavity in a manner such that at least part of the cavity is in thermal contact with the heat sink; and providing thermal contact between the heat sink and at least one of the die, the subcarrier element, and the element.

12. The method according to claim 11, wherein thermal contact is provided by a thermally conducting material selected from a group consisting of at least one of a fluid, a glue, an epoxy, a resilient material, and a foam.

13. The method according to claim 4, wherein providing the subcarrier element further comprises providing the subcarrier element that is substantially stiff and electrically insulating and has a number of electrical conductors on a surface.

14. The method according to claim 4, wherein some of the conductors are provided so as to have the same or equivalent predetermined characteristic impedance.

* * * * *